United States Patent
Le et al.

(10) Patent No.: US 8,907,666 B2
(45) Date of Patent: Dec. 9, 2014

(54) MAGNETIC BIAS STRUCTURE FOR MAGNETORESISTIVE SENSOR HAVING A SCISSOR STRUCTURE

(75) Inventors: Quang Le, San Jose, CA (US); Simon H. Liao, Fremont, CA (US); Shuxia Wang, San Jose, CA (US); Guangli Liu, Pleasanton, CA (US); Yongchul Ahn, San Jose, CA (US)

(73) Assignee: HGST Netherlands B.V., Amsterdam (NL)

( * ) Notice: Subject to any disclaimer, the term of this patent is extended or adjusted under 35 U.S.C. 154(b) by 390 days.

(21) Appl. No.: 13/251,100

(22) Filed: Sep. 30, 2011

(65) Prior Publication Data

US 2013/0082696 A1  Apr. 4, 2013

(51) Int. Cl.
  *G01R 33/02* (2006.01)
  *G01R 33/00* (2006.01)
  *G01R 33/09* (2006.01)

(52) U.S. Cl.
  CPC ........ *G01R 33/0011* (2013.01); *G01R 33/0017* (2013.01); *G01R 33/093* (2013.01)
  USPC ........... 324/244; 324/246; 324/249; 324/252; 324/259; 324/263; 360/31; 360/274; 360/324.11; 360/324.12; 360/324.2; 427/131; 427/598

(58) Field of Classification Search
  USPC ......... 324/244, 246, 249, 252, 259, 260, 263, 324/213, 219, 179; 360/31, 274, 324.1, 360/324.11, 324.12, 324.2, 325, 326, 327, 360/313, 235.4; 257/E43.004, E43.006
  See application file for complete search history.

(56) References Cited

U.S. PATENT DOCUMENTS

| | | | |
|---|---|---|---|
| 5,576,914 A | 11/1996 | Rottmayer et al. | |
| 5,714,679 A * | 2/1998 | Nichols et al. | 73/35.08 |
| 5,818,685 A | 10/1998 | Thayamballi et al. | |
| 5,880,912 A | 3/1999 | Rottmayer | |
| 6,005,753 A | 12/1999 | Fontana, Jr. et al. | |
| 6,310,590 B1 * | 10/2001 | Havel | 345/83 |
| 6,667,862 B2 | 12/2003 | Zhu | |
| 6,724,583 B2 | 4/2004 | Seigler et al. | |
| 6,847,509 B2 | 1/2005 | Yoshikawa et al. | |

(Continued)

OTHER PUBLICATIONS

Chenchen, J. W. et al., "Magnetization Reversal Process of Tri-Layer Readers for Ultrahigh Density Data Storage," IEEE Transactions on Magnetics, Jun. 2010, vol. 46, No. 6, pp. 1385-1388.

(Continued)

*Primary Examiner* — Tung X Nguyen
*Assistant Examiner* — Thang Le
(74) *Attorney, Agent, or Firm* — Zilka-Kotab, PC

(57) ABSTRACT

A scissor style magnetic sensor having a novel hard bias structure for improved magnetic biasing robustness. The sensor includes a sensor stack that includes first and second magnetic layers separated by a non-magnetic layer such as an electrically insulating barrier layer or an electrically conductive spacer layer. The first and second magnetic layers have magnetizations that are antiparallel coupled, but that are canted in a direction that is neither parallel with nor perpendicular to the air bearing surface by a magnetic bias structure. The magnetic bias structure includes a neck portion extending from the back edge of the sensor stack and having first and second sides that are aligned with first and second sides of the sensor stack. The bias structure also includes a tapered or wedged portion extending backward from the neck portion.

12 Claims, 18 Drawing Sheets

(56) References Cited

U.S. PATENT DOCUMENTS

| | | | |
|---|---|---|---|
| 6,914,759 B2 | 7/2005 | Chen et al. | |
| 7,034,517 B2 * | 4/2006 | Newcombe | 324/115 |
| 7,035,062 B1 | 4/2006 | Mao et al. | |
| 7,177,122 B2 | 2/2007 | Hou et al. | |
| 7,365,949 B2 | 4/2008 | Hayakawa et al. | |
| 7,522,389 B2 | 4/2009 | Sbiaa et al. | |
| 7,715,153 B2 | 5/2010 | Mizuno et al. | |
| 7,719,802 B2 | 5/2010 | Kautzky et al. | |
| 7,813,086 B2 | 10/2010 | Tanaka et al. | |
| 7,843,668 B2 | 11/2010 | Machita et al. | |
| 7,869,165 B2 | 1/2011 | Miyauchi et al. | |
| 7,876,534 B2 | 1/2011 | Chou et al. | |
| 7,881,021 B2 | 2/2011 | Chou et al. | |
| 8,208,230 B2 * | 6/2012 | Liu | 360/324.12 |
| 8,599,520 B1 * | 12/2013 | Liu et al. | 360/324.1 |
| 2002/0012209 A1 | 1/2002 | Ajiki et al. | |
| 2006/0209471 A1 * | 9/2006 | Nagasaka et al. | 360/324.1 |
| 2007/0030603 A1 | 2/2007 | Sato et al. | |
| 2007/0217086 A1 | 9/2007 | Matsubara et al. | |
| 2009/0073616 A1 * | 3/2009 | Shimazawa et al. | 360/319 |
| 2009/0109580 A1 * | 4/2009 | Ayukawa et al. | 360/324.12 |
| 2009/0207533 A1 | 8/2009 | Shimazawa | |
| 2009/0213502 A1 * | 8/2009 | Miyauchi et al. | 360/319 |
| 2010/0039734 A1 | 2/2010 | Hara et al. | |
| 2010/0103562 A1 | 4/2010 | Machita et al. | |
| 2010/0142100 A1 | 6/2010 | Yoshida et al. | |
| 2010/0232074 A1 * | 9/2010 | Machita et al. | 360/324.11 |
| 2011/0007426 A1 * | 1/2011 | Qiu et al. | 360/313 |
| 2011/0069417 A1 | 3/2011 | Kawamori et al. | |
| 2013/0083432 A1 | 4/2013 | Le et al. | |

OTHER PUBLICATIONS

Restriction Requirement from U.S. Appl. No. 13/249,076, dated Jun. 14, 2013.

Non-Final Office Action from U.S. Appl. No. 13/249,076, dated Aug. 23, 2013.

* cited by examiner

| Type | I | II | III | IV | V | VI |
|---|---|---|---|---|---|---|
| Description | Rectangular | Wide rectangular | Wedge | Sharper wedge | Neck and wedge | Neck and sharper wedge |
| Shape |  |  |  |  |  |  |
| HBF* increase | 0 (reference) | 50% | 84% | 99% | 109% | 117% |

MAGNETIC BIAS STRUCTURE FOR MAGNETORESISTIVE SENSOR HAVING A SCISSOR STRUCTURE

FIELD OF THE INVENTION

The present invention relates to magnetic data recording and more particularly to an improved magnetic hard bias structure for use with a scissor type magnetoresistive sensor.

BACKGROUND OF THE INVENTION

The heart of a computer is an assembly that is referred to as a magnetic disk drive. The magnetic disk drive includes a rotating magnetic disk, write and read heads that are suspended by a suspension arm adjacent to a surface of the rotating magnetic disk and an actuator that swings the suspension arm to place the read and write heads over selected circular tracks on the rotating disk. The read and write heads are directly located on a slider that has an air bearing surface (ABS). The suspension arm biases the slider into contact with the surface of the disk when the disk is not rotating, but when the disk rotates air is swirled by the rotating disk. When the slider rides on the air bearing, the write and read heads are employed for writing magnetic impressions to and reading magnetic impressions from the rotating disk. The read and write heads are connected to processing circuitry that operates according to a computer program to implement the writing and reading functions.

The write head includes at least one coil, a write pole and one or more return poles. Whet a current flows through the coil, a resulting magnetic field causes a magnetic flux to flow through the write pole, which results in a magnetic write field emitting from the tip of the write pole. This magnetic field is sufficiently strong that it locally magnetizes a portion of the adjacent magnetic disk, thereby recording a bit of data. The write field, then, travels through a magnetically soft underlayer of the magnetic medium to return to the return pole of the write head.

A magnetoresistive sensor such as a Giant Magnetoresistive (GMR) sensor, or a Tunnel Junction Magnetoresivive (TMR) sensor can be employed to read a magnetic signal from the magnetic media. The sensor includes a nonmagnetic conductive layer (if the sensor is a GMR sensor) or a thin nonmagnetic, electrically insulating barrier layer (if the sensor is a TMR sensor) sandwiched between first and second ferromagnetic layers, hereinafter referred to as a pinned layer and a free layer. Magnetic shields are positioned above and below the sensor stack and can also serve as first and second electrical leads so that the electrical current travels perpendicularly to the plane of the free layer, spacer layer and pinned layer (current perpendicular to the plane (CPP) mode of operation). The magnetization direction of the pinned layer is pinned perpendicular to the air bearing surface (ABS) and the magnetization direction of the free layer is located parallel to the ABS, but free to rotate in response to external magnetic fields. The magnetization of the pinned layer is typically pinned by exchange coupling with an antiferromagnetic layer.

When the magnetizations of the pinned and free layers are parallel with respect to one another, scattering of the conduction electrons is minimized and when the magnetizations of the pinned and free layer are antiparallel, scattering is maximized. In a read mode the resistance of the spin valve sensor changes about linearly with the magnitudes of the magnetic fields from the rotating disk. When a sense current is conducted through the spin valve sensor, resistance changes cause potential changes that are detected and processed as playback signals.

With the need to ever increase data density various novel sensor structures have been investigated. One way to increase data density is to reduce the sensor gap thickness which defines the bit length. Standard GMR or TMR sensors use an antiferromagnetic layer to pin the pinned layer structure of the sensor. In order to function as an antiferromagnetic layer, these layers must be very thick relative to the other sensor layers. This of course increases the gap thickness, which increases the bit length, which decreases data density.

A sensor that has been investigated to overcome this challenge is a sensor that is known as a scissor sensor. Such a sensor has two free magnetic layers with magnetizations that move in a scissor fashion relative to each other. Such a sensor shows promise because it does not require a thick antiferromagnetic layer. However, such a sensor presents challenges with regard to magnetic biasing of the two free layers. Therefore, there remains a need for a sensor that can reduce gap thickness such as by eliminating an AFM layer, while providing robust, reliable and workable biasing of the magnetic layers.

SUMMARY OF THE INVENTION

The present invention provides a magnetic sensor comprising, a sensor stack including first and second magnetic layers and a non magnetic layer sandwiched between the first and second magnetic layers, the sensor stack having a front edge located at an air bearing surface a back edge located opposite the front edge and first and second laterally opposed sides each extending from the front edge to the back edge. The sensor also includes a magnetic bias structure located adjacent to the back edge of the sensor stack for providing a magnetic bias field to the sensor stack, the magnetic bias structure including a neck portion near the sensor stack that has first and second sides that are aligned with the first and second sides of the sensor stack and having a flared portion.

The magnetic sensor can be constructed by a method that includes forming a magnetic shield and depositing a series of sensor layers over the magnetic shield. A first mask is formed over the series of sensor layers, the first mask being configured to define front and back edges of a sensor structure. A first ion milling is performed to remove portions of the series of sensor layers that are not protected by the first mask, thereby defining front and back edge of the sensor structure. A magnetic hard bias material is deposited, and the first mask is removed. A second mask is then formed, the second mask including a portion configured to define a sensor width and having another portion configured to define a shape of a magnetic hard bias structure extending from the back edge of the sensor. A second ion milling is performed to remove portions of the sensor material and magnetic hard bias material that are not protected by the second mask.

The novel hard bias structure having a neck portion that is aligned with the first and second sides of the sensor stack and having a tapered or wedged portion extending backwards from the neck portion provides a strong robust magnetic bias field for biasing the magnetic layers of the sensor stack. This bias field can be optimized by forming the tapered or wedged portion with side edges that define an angle of 25-50 degrees with respect to the air bearing surface.

These and other features and advantages of the invention will be apparent upon reading of the following detailed description of preferred embodiments taken in conjunction with the Figures in which like reference numerals indicate like elements throughout.

BRIEF DESCRIPTION OF THE DRAWINGS

For a fuller understanding of the nature and advantages of this invention, as well as the preferred mode of use, reference should be made to the following detailed description read in conjunction with the accompanying drawings which are not to scale.

DETAILED DESCRIPTION OF THE PREFERRED EMBODIMENTS

The following description is of the best embodiments presently contemplated for carrying out this invention. This description is made for the purpose of illustrating the general principles of this invention and is not meant to limit the inventive concepts claimed herein.

Figure 1:
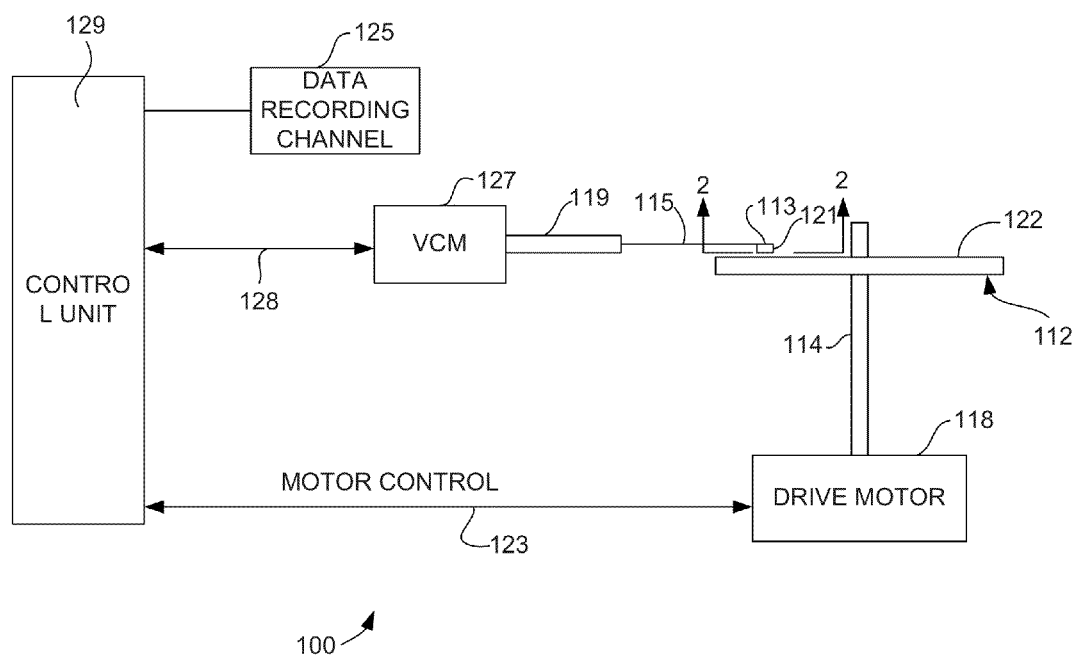
FIG. 1 is a schematic illustration of a disk drive system in which the invention might be embodied.

Referring now to FIG. 1, there is shown a disk drive 100 embodying this invention. As shown in FIG. 1, at least one rotatable magnetic disk 112 is supported on a spindle 114 and rotated by a disk drive motor 118. The magnetic recording on each disk is in the form of annular patterns of concentric data tracks (not shown) on the magnetic disk 112.

At least one slider 113 is positioned near the magnetic disk 112, each slider 113 supporting one or more magnetic head assemblies 121. As the magnetic disk rotates, slider 113 moves radially in and out over the disk surface 122 so that the magnetic head assembly 121 can access different tracks of the magnetic disk where desired data are written. Each slider 113 is attached to an actuator arm 119 by way of a suspension 115. The suspension 115 provides a slight spring force which biases slider 113 against the disk surface 122. Each actuator arm 119 is attached to an actuator means 127. The actuator means 127 as shown in FIG. 1 may be a voice cod motor (VCM). The VCM comprises a coil movable within a fixed magnetic field, the direction and speed of the coil movements being controlled by the motor current signals supplied by controller 129.

During operation of the disk storage system, the rotation of the magnetic disk 112 generates an air bearing between the slider 113 and the disk surface 122 which exerts an upward force or lift on the slider. The air bearing thus counter-balances the slight spring force of suspension 115 and supports slider 113 off and slightly above the disk surface by a small, substantially constant spacing during normal operation.

The various components of the disk storage system are controlled in operation by control signals generated by control unit 129, such as access control signals and internal dock signals. Typically, the control unit 129 comprises logic control circuits, storage means and a microprocessor. The control unit 129 generates control signals to control various system operations such as drive motor control signals on line 123 and head position and seek control signals on line 128. The control signals on line 128 provide the desired current profiles to optimally move and position slider 113 to the desired data track on disk 112. Write and read signals are communicated to and from write and read heads 121 by way of recording channel 125.

Figure 2:
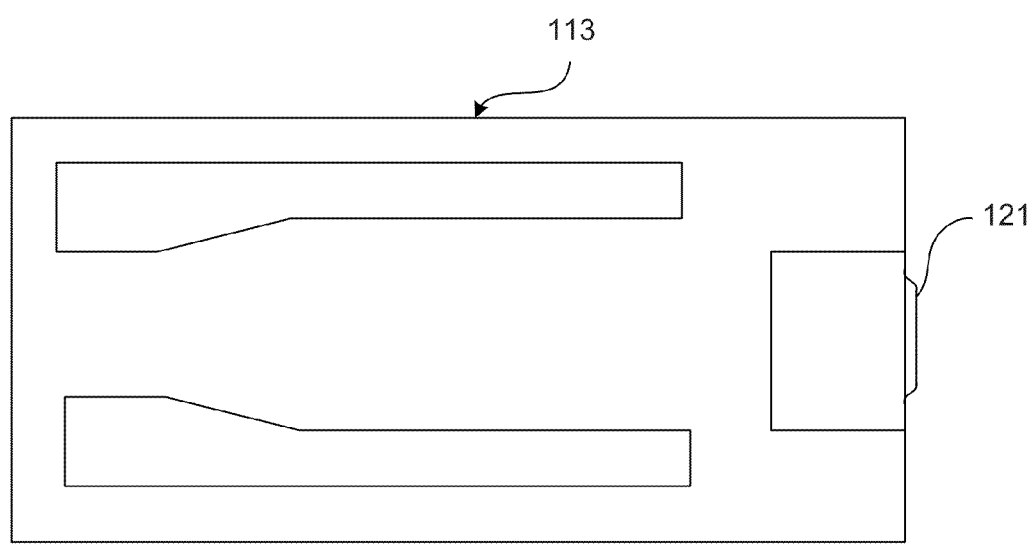
FIG. 2 is an ABS view of a slider illustrating the location of a magnetic head thereon.

With reference to FIG. 2, the orientation of the magnetic head 121 in a slider 113 can be seen in more detail. FIG. 2 is an ABS view of the slider 113, and as can be seen the magnetic head including an inductive write head and a read sensor, is located at a trailing edge of the slider. The above description of a typical magnetic disk storage system and the accompanying illustration of FIG. 1 are for representation purposes only. It should be apparent that disk storage systems may contain a large number of disks and actuators, and each actuator may support a number of sliders.

Figure 3:
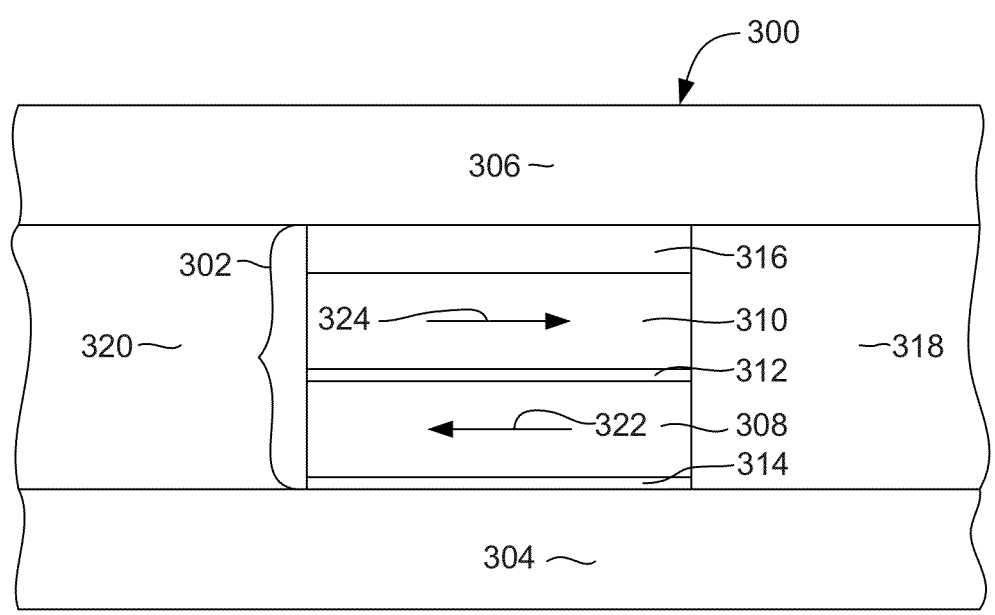
FIG. 3 is an enlarged ABS view of a magnetoresistive sensor according to an embodiment of the invention.

FIG. 3 shows an air bearing surface (ABS) view of a magnetic sensor 300 according to an embodiment of the invention. The sensor 300 includes a sensor stack 302 that is sandwiched between first and second magnetic shields 304, 306 that cal be formed of an electrically conductive magnetic material so that they can function as electrical leads for supplying a sense current to the sensor stack 302 as well as functioning as magnetic shields.

The sensor stack 302 includes first and second magnetic layers 308, 310 with a thin non-magnetic layer 312 sandwiched between the magnetic layers 308, 310. The sensor 300 is preferably a tunnel junction sensor, wherein the layer 312 is a non-magnetic, electrically insulating layer such as MgO. However, the sensor 300 could also be a giant magnetoresistive sensor (GMR sensor), in which case the layer 312 would be a non-magnetic, electrically conductive layer such as Cu, Ag, AgSn. The sensor stack 302 can also include a seed layer 314, provided at the bottom of the sensor stack 300 to initiate a desired grain formation in the above formed layers. The sensor stack 300 can also include a capping lay 316 such as Ru/Ta/Ru or Ru to protect the under-lying sensor layers during manufacture. The space to either side of the sensor stack 302, between the magnetic shields 306, 304 is filled with a non-magnetic, electrically insulating material 318, 320 such as alumina as well as other non-magnetic, electrically insulating materials, as will be seen.

The magnetic layers 308, 310 have a magnetic anisotropy that tends to align magnetizations 322, 324 of the magnetic layers in anti-parallel directions parallel with the air bearing surface (ABS) as shown. However, the magnetizations 322, 324 are canted away from being perfectly parallel with the ABS by a magnetic bias structure that will be described in greater detail herein below.

Figure 4:
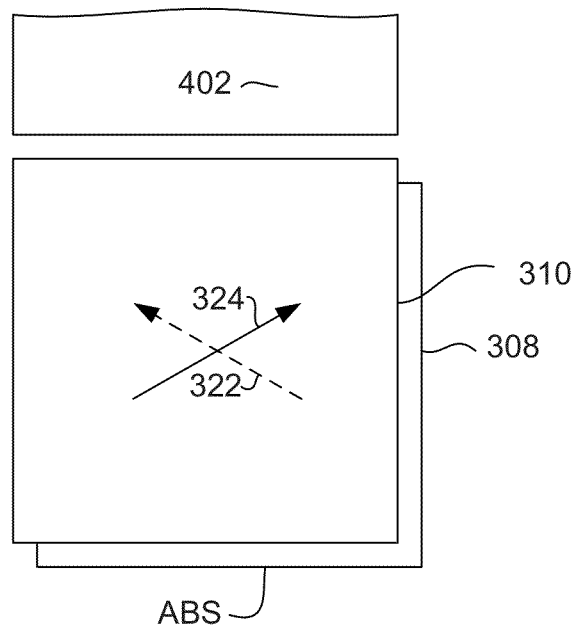
FIG. 4 is an exploded, top-down, schematic view of layers of the magnetoresistive sensor of FIG. 3.

FIG. 4 shows a top down, exploded, schematic view of the magnetic layers 308, 310 and magnetizations 322, 324. The magnetization 322 is shown in dashed line to indicate that it is the magnetization of the layer 308, which is hidden behind the magnetic layer 310. A magnetic bias structure 402 located behind the air bearing surface (ABS), which applies a magnetic bias field that pulls the magnetizations 322, 324 away from being parallel with the ABS and away from being perfectly anti-parallel with one another. In the presence of an external magnetic field, such as from a magnetic medium, the magnetizations 322, 324 will deflect so that they are either more or less anti-parallel or parallel with one another. This change in the relative orientations 322, 324 of the magnetic layers 308, 310 changes the electrical resistance through the sensor stack 302 (FIG. 3) based on the spin dependent tunneling effect of electrons passing through the thin barrier layer 312.

Because the relative movement of the magnetizations 322, 324 resembles the motion of a scissor during operation, such a sensor can be referred to as a scissor sensor or scissor TMR sensor. In order for such as scissor sensor to operate effectively and reliably, the magnetic bias field provided by the bias layer 402 must be sufficiently strong to overcome the magnetic anisotropy of the magnetic layers 308, 310 to keep the magnetizations 322, 324 generally perpendicular to one another in the absence of an external magnetic field. Keeping the magnetizations 322, 324 oriented in this manner, so that the pivot about a perpendicular orientation, ensures that a signal processed from such as sensor is within the linear region of the signal curve. Therefore, in order to provide excellent sensor performance it is necessary to provide a hard bias structure 402 that provides robust biasing.

Figure 5:
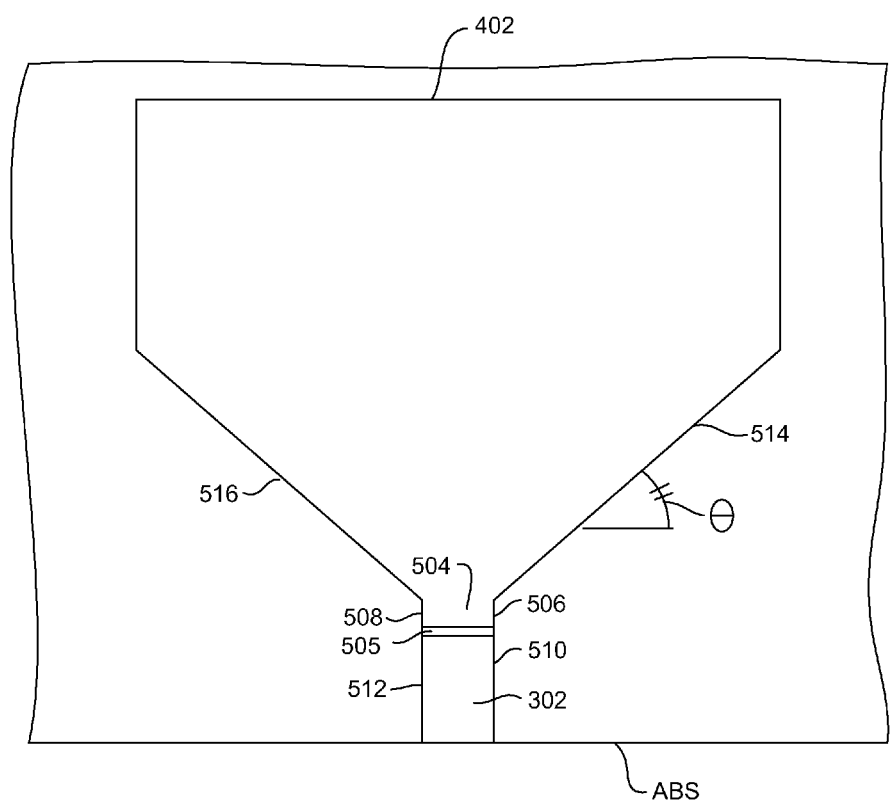
FIG. 5 is a top down view of a magnetoresistive sensor and magnetic bias structure.

FIG. 5 shows an expanded view of a sensor stack 302 and hard bias structure 402 according to an embodiment of the invention. Areas outside of the sensor stack 302 and hard bias structure can be filled with a non-magnetic, electrically insulating material such as alumina and may include the fill layers 318, 320 described above with reference to FIG. 3. Also, the sensor 302 is separated from the hard bias structure 402 by a thin, non-magnetic, electrically insulating layer 505, which can be a material such as alumina and which preferably also covers the bottom shield 304 in order to prevent shunting of sense current through the hard bias layer 402.

As can be seen, the hard bias structure includes a neck portion 504 that has sides 506, 508 that are generally parallel with and aligned width first and second sides 510, 512 of the sensor stack 302. The hard bias structure 402 also includes a flared portion having flared sides 514, 516. These flared sides 514, 516, preferably define an angle θ of 25-50 degrees relative to a plane that is parallel with the air bearing surface (ABS). The inventors have found that this range of angles, along with the neck portion 504, provide and an optimal magnetic bias field for use with a scissor type sensor.

Figure 6:
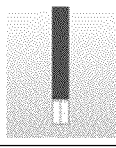
FIG. 6 is a table illustrating bias fields for various hard bias structure configurations.
Figure 6:
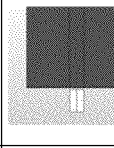
Figure 6:
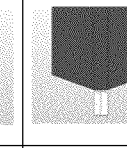
Figure 6:
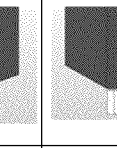
Figure 6:
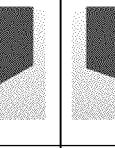
Figure 6:

The benefit of the above described hard bias structure 402 can be better understood with reference to FIG. 6 which shows the hard bias field for various hard bias layer shapes. For purposes of the table of FIG. 6, the hard bias field (HBF) is the field as measured at the center of the sensor 302 (FIG. 5). In the table of FIG. 6, a basic hard bias structure that extends straight back from the sensor is shown in column I and is used as a reference for the other hard bias shapes. Because this is the reference shape, the HBF for this structure in column I is denoted as being zero for purposes of comparison with the other shapes. Column II shows that a bias structure that is significantly wider than the sensor, but extends straight outward from the sensor has a 50% increase in bias field compared with the structure of column I. Column III shows that the bias field for a bias structure having a wedge shape (i.e. shallow tapered front edge) with the taper initiating right at the back edge of the sensor (e.g. no neck portion) provides an 84% increase in bias field. Column IV shows a structure similar to that of column III, but with a sharper taper, and shows that this structure provides a 99% increase in bias field. In column III, the taper angle is 25-50 degrees relative to a plane that is parallel with the air bearing surface. Column V shows a bias structure having a shallow taper and also having a neck portion at the back edge of the sensor. As can be seen, this structure provides a 109% increase in bias field. Finally, column VI shows the bias field from a bias structure that has both a neck and a steep tapered wedge (forming an angle of 25-50 degrees relative to the air bearing surface). This structure provides a bias field that has a 117% increase compared with the structure of column I. As can be seen, this structure of column VI provides the highest bias field of all of the structures shown in FIG. 6.

Figure 18:
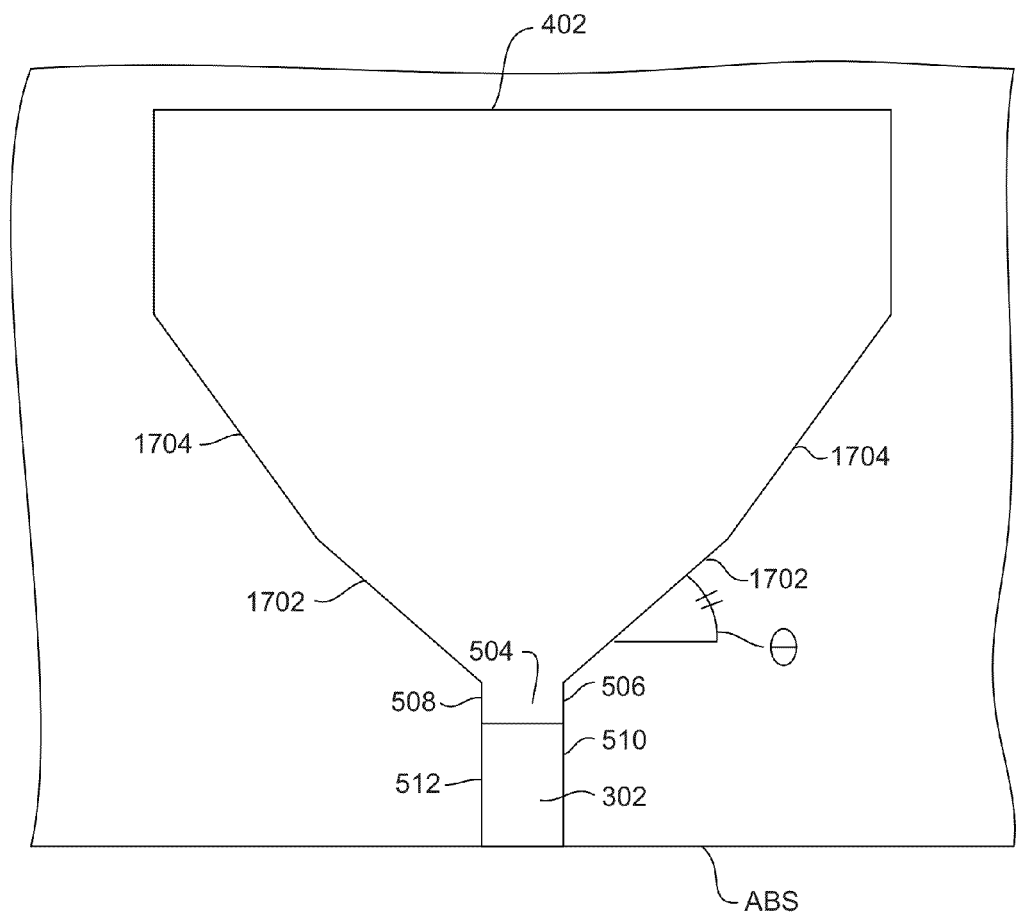
FIG. 18 is a top down view of a top down view of a magnetoresistive sensor and hard bias structure according to an alternate embodiment of the invention.

FIG. 18 shows a top down view of a magnetoresistive sensor 302 having a hard bias structure 1800 according to an alternate embodiment of the invention. Like the embodiment described above with regard to FIG. 5, the hard bias structure 1800 extends from the back edge of the sensor 302 and is separated from the sensor by a thin insulation layer 505. The hard bias structure includes a neck portion 504. The bias structure also includes a flared portion having a front edge portion 1702 (nearest to the neck 504) that defines an angle θ of 25-50 degrees with respect to the ABS. The hard bias structure 1800 also includes a second tapered edge portion 1704 that is further from the neck portion 504 than the first edge portion 1702, the edge 1704 defining an angle with respect to the ABS that is greater than θ, but which is less than 90 degrees.

Figure 7:
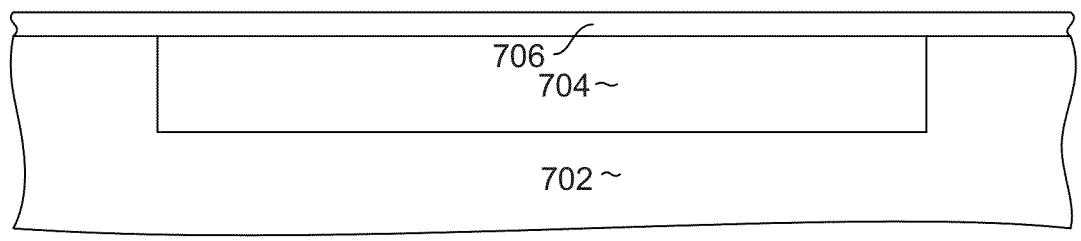
FIGS. 7-17 are views of a magnetic sensor in various intermediate stages of manufacture, illustrating a method for manufacturing a magnetic sensor and hard bias structure according to an embodiment of the invention.

FIGS. 7 through 17, illustrate a method for manufacturing a scissor style magnetic sensor having a magnetic bias structure according to an embodiment of the invention. With particular reference to FIG. 7, a substrate 702 is provided, which can be a layer of a non-magnetic, electrically insulating material such as alumina. An electrically conductive, magnetic shield 704, constructed of a material such as NiFe is formed on or into the substrate 702. The shield 704 is preferably constructed such that the shield is embedded into the substrate 702 and has an upper surface that is coplanar with the surface of the substrate. 702. A series of sensor layers 706 is deposited over the magnetic shield 704 and the substrate 702. The series of sensor layers can include layers of the sensor stack 302 described above with reference to FIG. 3, but also includes layers of sensors having various other structures as well. The series of sensor layers 706 preferably includes a layer of material that is resistant to chemical mechanical polishing (CMP resistant material) such as diamond like carbon (DLC) or amorphous carbon a its top.

Figure 8:
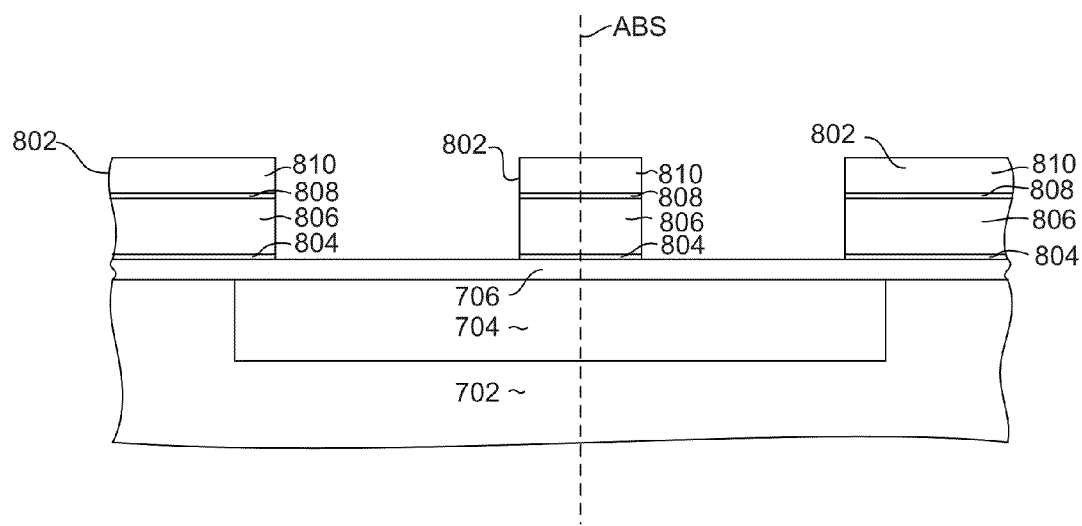
Figure 9:
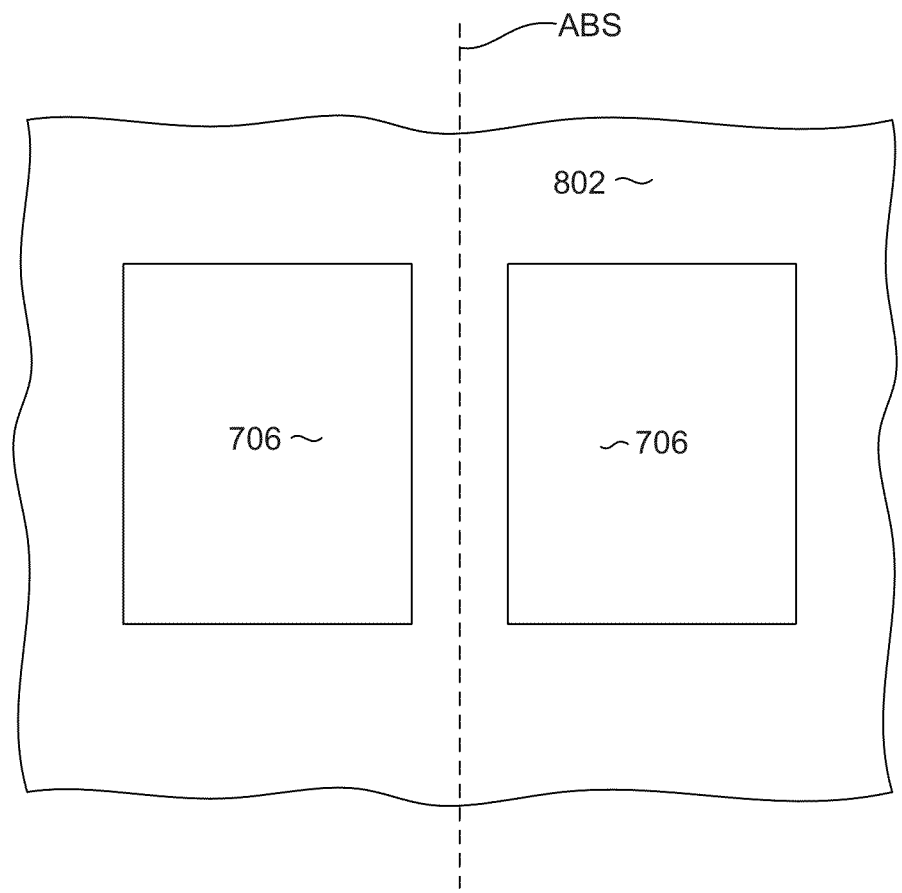

Then, with reference to FIG. 8, a mask structure 802 is formed. This mask structure can include various layers. These various mask layers can include, for example, a bottom hard mask layer 804 preferably constructed of a material that is resistant to chemical mechanical polishing, an image transfer layer, such as DURIMIDE® 806, an optional top hard mask/bottom antireflective coating layer 808, and a photoresist layer 810. The photoresist layer 810 can be patterned as desired by a photolithographic patterning and developing process, and the pattern of this image transfer layer can be transferred onto the underlying layers 804, 806, 808 by one or more reactive ion etching processes and/or ion milling. The patterned mask 802 has a central covered portion 804 (which will define a sensor area and first and second openings at either end of the central portion. The dashed line denoted (ABS) indicates the location of the air bearing surface plane. Therefore, the openings in the mask are in front of and behind the sensor area. The pattern of the mask 802 can be better understood with reference to FIG. 9 which shows a top down view of the mask 802 and openings through which the sensor layers 706 are exposed.

Figure 10:
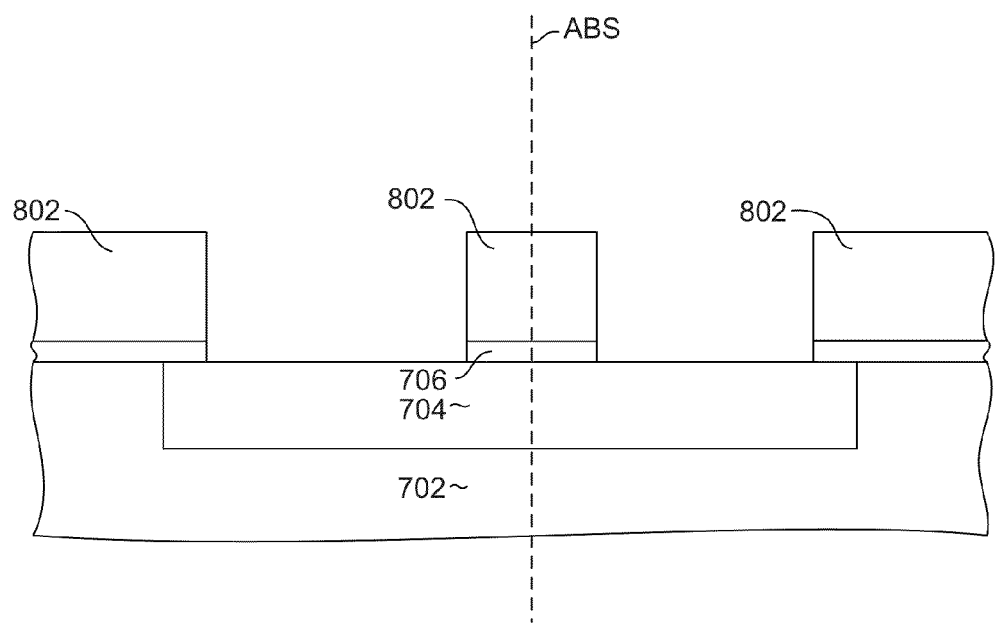
Figure 11:
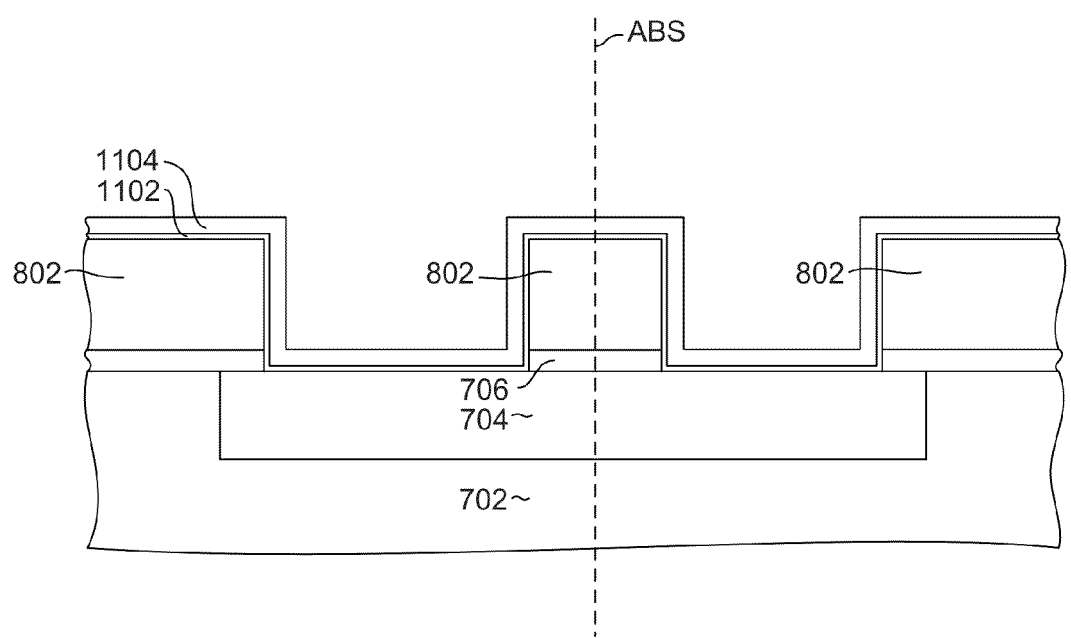

With the mask thus formed, an ion milling process is performed to remove portions of the sensor layers 706 that are not protected by the mask (e.g. parts that are exposed through the openings in the mask 802), leaving a structure as shown in FIG. 10. Then, as show in FIG. 11, a thin insulation layer 1102 is deposited followed by a layer of magnetic material having a high coercivity, (hard magnetic material) 1104. The insulation layer can be SiN and is preferably deposited by a conformal deposition process such as ion beam deposition to a thickness of about 30 Angstroms. The hard magnetic material 1104 can be constructed of a material such as CoPt or CoPtCr and is preferably deposited to at thickness that is about as high as the height of the sensor layers 706. The hard bias layer 1104 is preferably deposited to a thickness that is about 4 times the thickness of the insulation layer or about 120 Angstroms.

Figure 12:
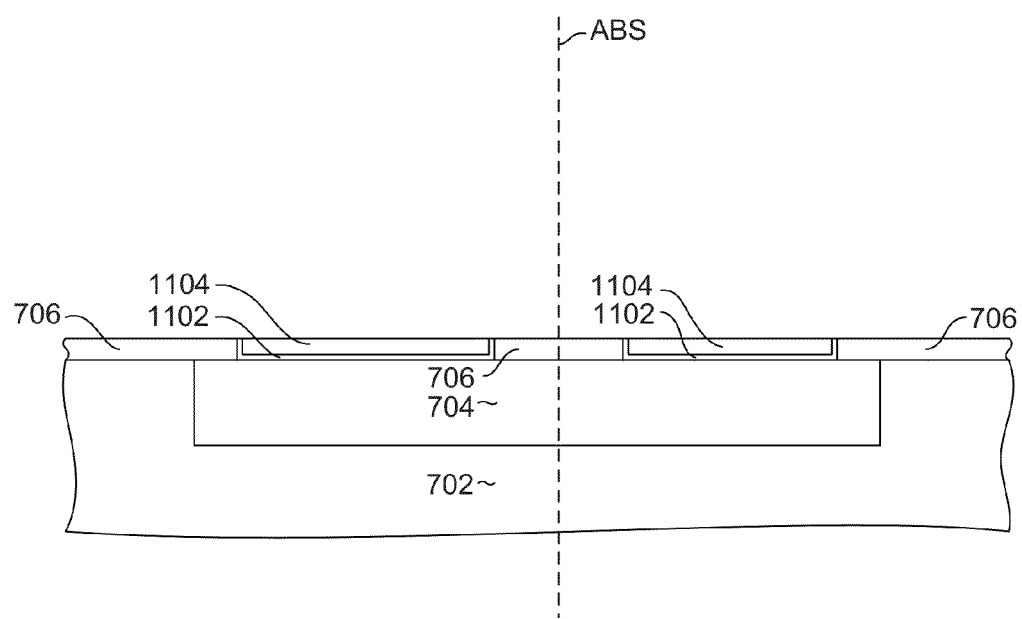

Then, another layer of material that is resistant to chemical mechanical polishing (CMP resistant material) such as diamond like carbon (not shown) is deposited. A wrinkle bake process is then performed, followed by a chemical liftoff process to remove the mask 802. This is followed by a chemical mechanical polishing process, which is then followed by a reactive ion etching to remove the CMP resistant material. These processes leave a planarized structure as shown in FIG. 12, having a smooth planar surface 1202 across the hard bias layers 1104 and the sensor material 706.

Figure 13:
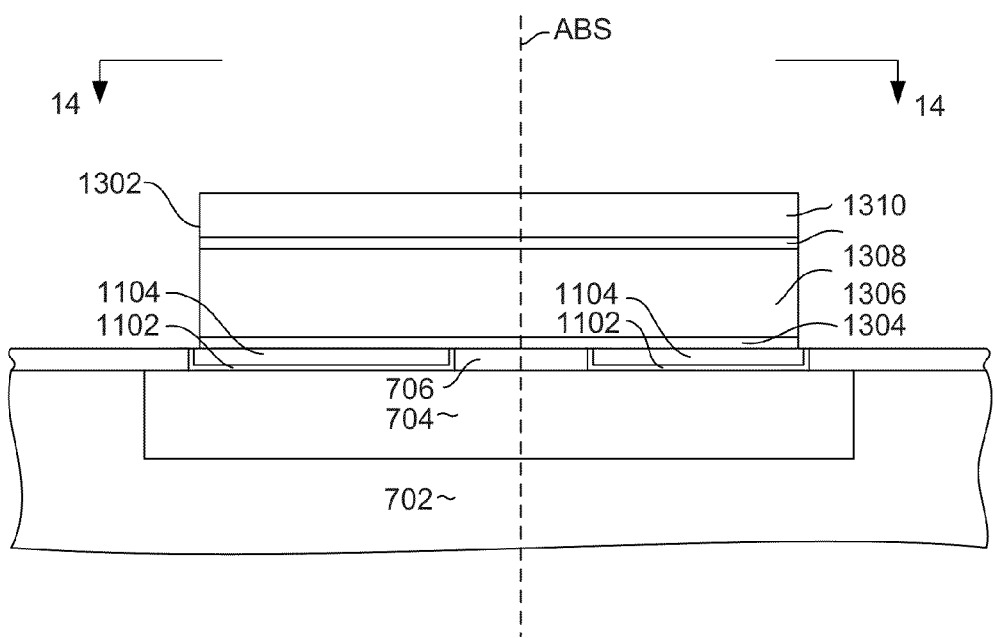

With reference now to FIG. 13, another mask structure 1302 is formed. Like the previously formed mask 802, the mask 1302 can include a CMP resistant hard mask 1304 such as DLC, an image transfer layer 1306 such as DURIMIDE®, an optional top hard mask/bottom antireflective coating layer 1308 and a photoresist mask 1310. The photoresist mask 1310 is photolithographically patterned to the desired mask shape, and the shape of the photoresist mask 1310 can be transferred onto the underlying layers 1304, 1306, 1308 by one or more reactive ion etching processes.

Figure 14:
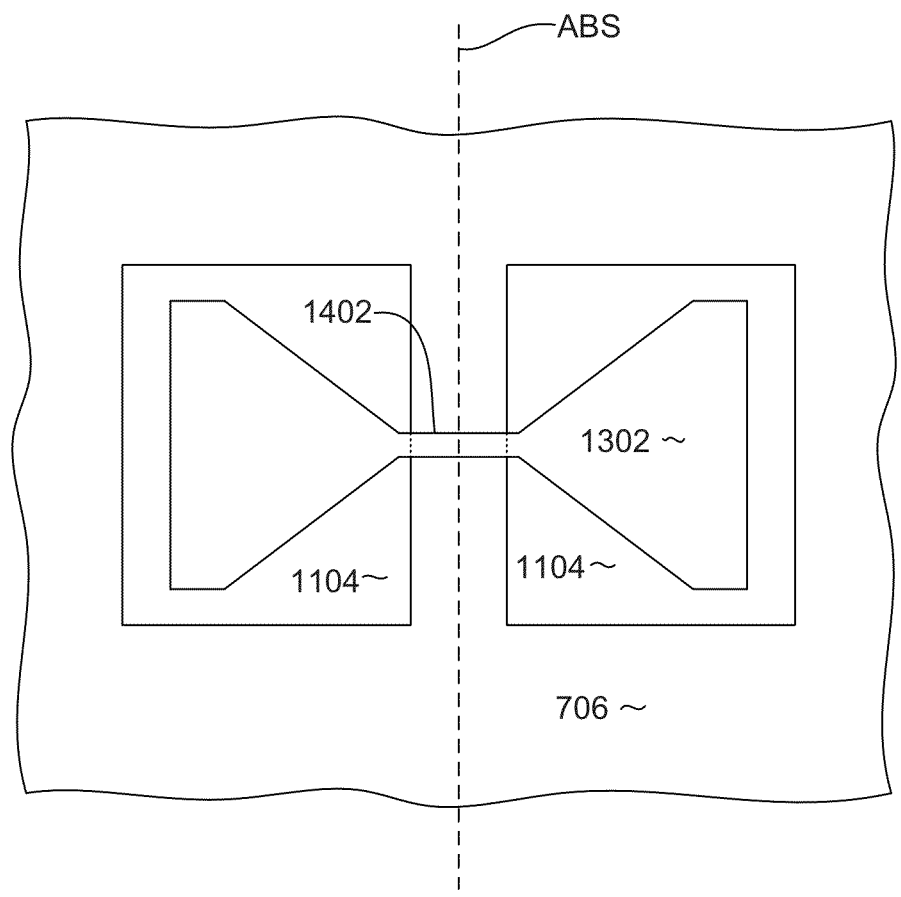
Figure 15:
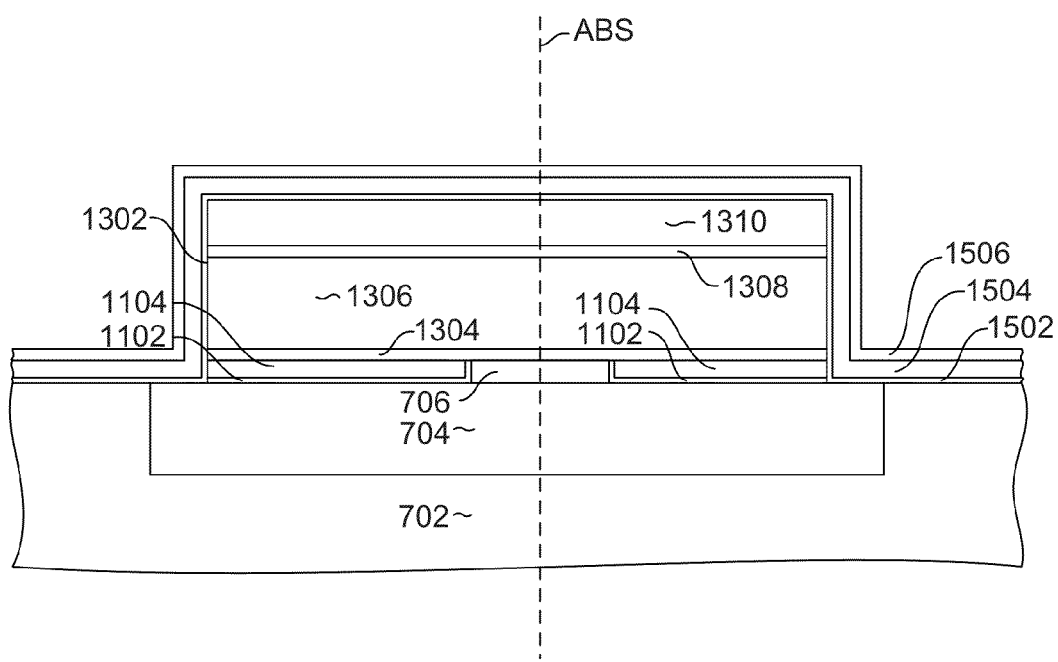

The pattern of the mask 1302 can be better seen with reference to FIG. 14 which shows a top down view. As can be seen, the mask 1302 has a narrow, constant width, throat portion 1402 that extends over the portion of the sensor material layer 506 that is between the two portions of hard bias material 1104. Preferably, however, the throat portion 1402 also extends slightly over the hard bias material 1104 as well. This throat portion 1402 has a width that defines the width of the sensor 302 and that also defines the neck portion 504 of the hard bias structure 402 (as described above with reference to FIG. 5). The mask 1302 also has a flared portion 1404 that is formed over the hard bias material 1104. This flared portion will define the wedged or tapered portion of the hard bias layer structure as will be seen.

With the second mask 1302 in place, a second ion milling can be performed to remove sensor material 706 and hard bias material 1302 that is not protected by the mask 1302. Then, with reference to FIG. 15, a fill layer is deposited. Most preferably, this includes depositing an anti-diffusion layer such as 30 Angstroms of SiN 1502, followed by a non-magnetic, dielectric fill layer such as alumina 1504 followed by a CMP resistant layer such as about 2 Angstroms of diamond like carbon (DLC).

This can then be followed by a wrinkle bake process and a chemical liftoff process to remove all or a portion of the mask 1302, followed by a chemical mechanical polishing process to remove any remaining mask materials and to polarize the structure. A reactive ion etching RIE can then be performed to remove any of the remaining CMP resistant material 1506, 1304. This leaves a structure as show in FIG. 16, with all of the mask 1302 and CMP resistant material removed and with a smooth planar surface across the sensor material 706 hard bias 1104 and fill layer 1504.

Figure 16:
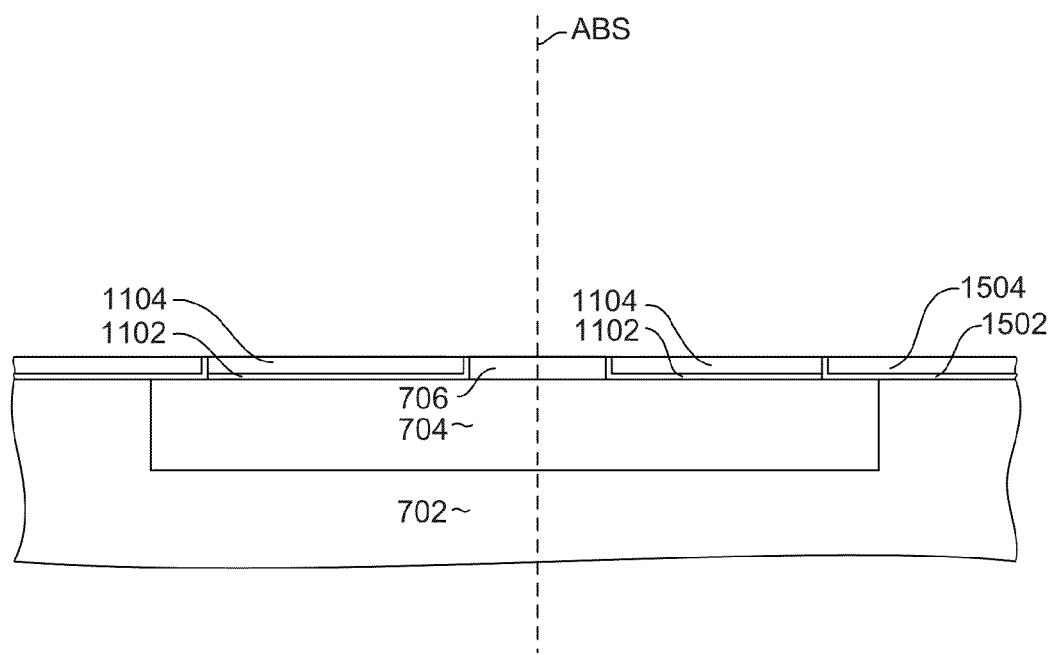
Figure 17:
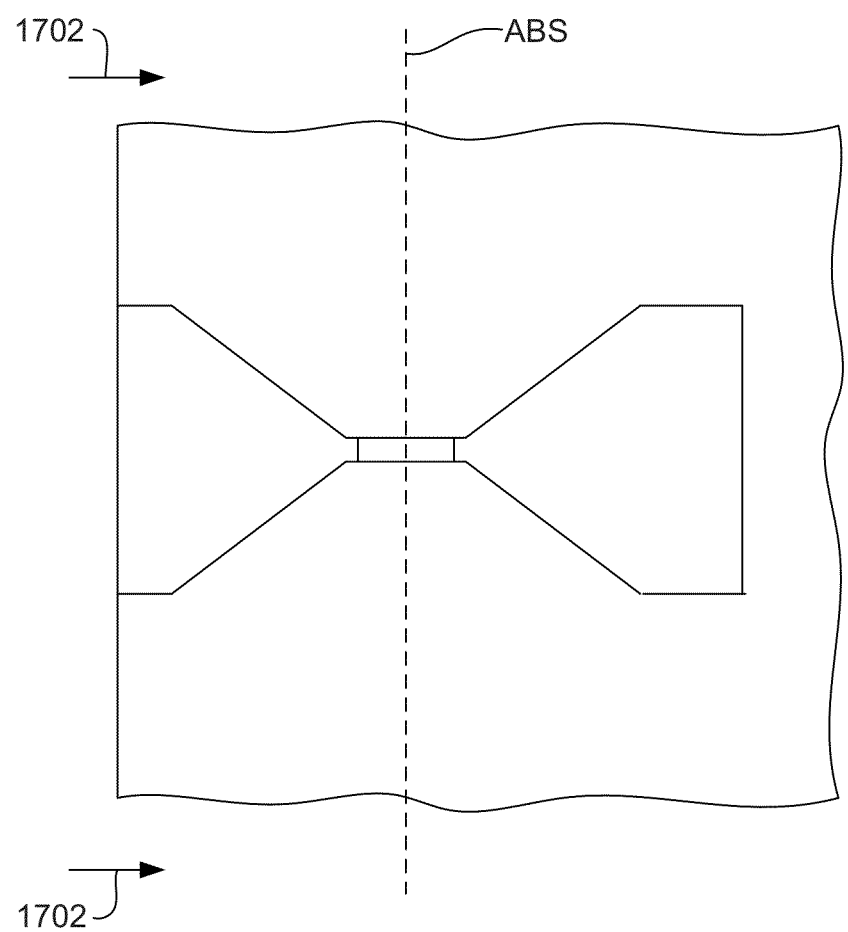

A magnetic material can then be electroplated over this structure to form an upper shield (not shown in FIG. 16, but shown as shield 306 in FIG. 3. FIG. 17 shows a top down view of the structure of FIG. 16. After the sensor and any other necessary structures have been formed (such as a write head, not shown), a dicing and lapping operation can be performed to define the air bearing surface. The lapping operation removes material from the direction indicated by arrows 1702 and is terminated when the air bearing surface plan (dashed line ABS) has been reached.

While various embodiments have been described above, it should be understood that they have been presented by way of example only and not limitation. Other embodiments falling within the scope of the invention may also become apparent to those skilled in the art. Thus, the breadth and scope of the invention should not be limited by any of the above-described exemplary embodiments, but should be defined only in accordance with the following claims and their equivalents.

What is claimed is:

1. A magnetic sensor comprising,
   a sensor stack including first and second magnetic layers and a non-magnetic layer sandwiched between the first and second magnetic layers, the sensor stack having a front edge located at an air bearing surface, a back edge located opposite the front edge, and first and second laterally opposed sides each extending from the front edge to the back edge; and
   a magnetic bias structure located adjacent to the back edge of the sensor stack for providing a magnetic bias field to the sensor stack, the magnetic bias structure including a neck portion near the sensor stack that has first and second sides that are aligned with the first and second laterally opposed sides of the sensor stack and having a flared portion.

2. The magnetic sensor as in claim 1 wherein the flared portion of the magnetic bias structure has edges that define an angle that is less than 90 degrees and greater than 0 degrees with respect to a plane that is parallel with the air bearing surface.

3. The magnetic sensor as in claim 1 wherein the flared portion of the magnetic bias structure has edges that define an angle of 25-50 degrees with respect to a plane that is parallel with the air bearing surface.

4. The magnetic sensor as in claim 1 wherein the magnetic bias structure is separated from the sensor stack by a non-magnetic, electrically insulating layer.

5. The magnetic sensor as in claim 1 wherein each of the first and second magnetic layers of the sensor stack are magnetic free layers each having a magnetization that is free to move in response to the presence of an external magnetic field.

6. The magnetic sensor as in claim 1, wherein:
   each of the first and second magnetic layers has a magnetic anisotropy oriented in a direction parallel with the air bearing surface;
   the first and second magnetic layers are antiparallel coupled so that the magnetizations of the first and second magnetizations tend to orient antiparallel to one another;
   the magnetic bias field from the deflects the magnetizations of the first and second magnetic layers to a direction that is not parallel with the air bearing surface.

7. The magnetic sensor as in claim 6 wherein the magnetic bias field from the magnetic bias structure causes the magnetizations of the first and second magnetic layers to be oriented at about 45 degrees relative to the air bearing surface in the absence of an external magnetic field.

8. The magnetic sensor as in claim 6 wherein the magnetic bias field from the magnetic bias structure causes the magnetizations of the first and second magnetic layers to be oriented about 90 degrees relative to one another in the absence of an external magnetic field.

9. The magnetic sensor as in claim 1 wherein the magnetic bias structure comprises a magnetic material having a high magnetic coercivity.

10. The magnetic sensor as in claim 1 wherein the magnetic bias structure comprises CoPt.

11. The magnetic sensor as in claim 1 wherein the magnetic bias structure comprises CoPtCr.

12. The magnetic sensor as in claim 1 wherein the flared portion has a first edge portion that defines an angle of 25-50 degrees with respect to the air bearing surface and a second edge portion that defines an angle with respect to the air bearing surface that is greater than that of the first edge portion but that is less than 90 degrees.

* * * * *